United States Patent [19]

Otsubo et al.

[11] Patent Number: 4,801,987

[45] Date of Patent: Jan. 31, 1989

[54] JUNCTION TYPE FIELD EFFECT TRANSISTOR WITH METALLIZED OXIDE FILM

[75] Inventors: Mutsuyuki Otsubo, Itami; Yasuo Mitsui, Amagasaki, both of Japan

[73] Assignee: Mitsubishi Denki Kabushiki Kaisha, Tokyo, Japan

[21] Appl. No.: 774,879

[22] Filed: Sep. 12, 1985

Related U.S. Application Data

[63] Continuation-in-part of Ser. No. 409,899, Aug. 20, 1982, abandoned.

[30] Foreign Application Priority Data

Sep. 10, 1981 [JP] Japan .................................. 143596

[51] Int. Cl.[4] ............................................ H01L 29/80
[52] U.S. Cl. ..................................... 357/22; 357/15; 357/23.12
[58] Field of Search ..................... 357/22, 22 G, 22 P, 357/22 LA, 15, 15 A, 23.12, 22 I

[56] References Cited

U.S. PATENT DOCUMENTS

| 2,825,822 | 3/1958 | Huang | 357/22 X |
| 2,826,696 | 3/1958 | Suran | 357/22 X |
| 2,829,075 | 4/1958 | Pankove | 357/22 X |
| 2,832,898 | 4/1958 | Camp | 357/22 X |
| 2,836,797 | 5/1958 | Ozarow | 357/22 X |
| 2,887,415 | 5/1959 | Stevenson | 357/22 X |
| 3,615,938 | 10/1971 | Tsai | 357/22 X |
| 4,163,984 | 8/1979 | Pucel | 357/22 |
| 4,183,033 | 1/1980 | Rees | 357/22 |

OTHER PUBLICATIONS

Leheny et al., "An $In_{0.53} Ga_{0.47}$ As Junction Field-Effect Transistor," *IEEE Electron Device Letters*, vol. ED1 1, No. 6, Jun. 1980, pp. 110-111.
DiLorenzo et al., "GaAs+FET=Improved Microwave Systems," *Bell Labs, Rec.* (USA), vol. 56, No. 8, Sep. 1978, pp. 209-215.
Zvleeg et al., "Femto-Joule, High-Speed Planar GaAs E-JFET Logic," *Technical Digest of Iedm*, 1977 (International Electron Devices Meeting) pp. 198-200.
Fully Ion Implanted Planar GaAs E-JFET Process, G. L. Troeger, A. F. Behle, P. E. Friebertsauser, K. L. Hu and S. H. Watanabe, McDonnell Douglas Astronautics Company, Huntington Beach, California 92647, International Electron Devices Meeting, 1979, Washington, D.C., Dec. 3-5, pp. 497, 498 and 500.
"GaAs+FET=Improved Microwave Systems," DiLorenzo et al., *Bell Labs Rec.*, vol. 56, No. 8, Sep. 1978, pp. 209-215.
Vodicka et al., "Ion Implanted GaAs Enhancement Mode JFET's," Tech. Digest of IEDM 1975, pp. 625-628.

*Primary Examiner*—Andrew J. James
*Assistant Examiner*—William A. Mintel
*Attorney, Agent, or Firm*—Lowe Price LeBlanc Becker & Shur

[57] ABSTRACT

A gallium arsenide field effect transistor having a gate electrode of an alloy type p-n junction comprises source and drain electrodes formed on an n-type gallium arsenide region, a gate electrode of metal such as zinc or cadmium or an alloy of zinc or cadmium and gold, silver, tin or indium formed between the source and drain electrodes on the gallium arsenide region and serving as an impurity to the n-type gallium arsenide region, a p-type region being formed immediately beneath the gate electrode in the n-type gallium arsenide region. The above described field effect transistor is manufactured by the steps of: forming a source and drain electrodes on the n-type gallium arsenide region, depositing the gate electrode of the said metal or alloy, and heating the gallium arsenide region at the temperature lower than the melting point of the metal or the alloy, thereby to form the p-type region immediately beneath the gate electrode.

11 Claims, 2 Drawing Sheets

JUNCTION TYPE FIELD EFFECT TRANSISTOR WITH METALLIZED OXIDE FILM

This application is a continuation-in-part of application Ser. No. 409,899 filed Aug. 20, 1982, abandoned.

BACKGROUND OF THE INVENTION

1. Field of the Invention

The present invention relates to a junction type field effect transistor and a method of manufacturing the same. More specifically, the present invention relates to an improvement in a junction type field effect transistor employing a compound semiconductor and providing a junction between the semiconductor and an intermediate metallic compound in a metal oxide film, at a region having lateral dimensions substantially identical to a metal gate electrode used in the transistor.

2. Description of the Prior Art

One example of a junction type field effect transistor which constitutes the background of the invention comprises a normally off type gallium arsenide field effect transistor. A gallium arsenide field effect transistor operates at a higher speed than a silicon field effect transistor, inasmuch as a gallium arsenide field effect transistor utilizes gallium arsenide as a basic material, which has an electron saturation velocity more than two times larger than that of silicon and has an electron mobility four to five times higher than that of a silicon field effect transistor. Accordingly, it is expected that implementation of an integrated circuit with gallium arsenide field effect transistors achieves an operation thereof higher in speed than that of a silicon integrated circuit currently available. Gallium arsenide integrated circuits include two types, one employing normally-on type (depletion type) gallium arsenide field effect transistors as basic active devices and the other employing normally-off type (enhancement type) gallium arsenide field effect transistors as basic active devices. An integrated circuit employing normally-off type field effect transistors is characterized by a simple circuit configuration and law power consumption. As shown in FIG. 1, a field effect transistor in such a case typically employs a so-called MES type structure or a MES field effect transistor wherein a drain to source current is controlled by a Schottky gate electrode 5 formed on the surface of an n-type gallium arsenide active layer 2 at the area between a source electrode 3 and a drain electrode 4 both formed on the gallium arsenide n-type active layer 2. A normally-off type field effect transistor has a depletion layer 6 immediately beneath the gate electrode 5 with the outermost region thereof extending to reach the interface between a substrate 1 of a seminsulating material such as gallium arsenide and the n-type active layer 2 when the gate bias is zero, whereby complete interruption is established between the source electrode 3 and the drain electrode 4 and no drain current flows therebetween. When the gate electrode 5 is biased in the positive direction, the depletion layer 6 becomes thinner so that a drain current starts to flow. As the gate voltage is increased, the drain current is accordingly increased; however, since the positive voltage being applied to the gate electrode 5 is limited, the drain current becomes saturated at a predetermined value. The drain current is proportional to (a−d), where "a" denotes the width of the depletion layer 6 immediately beneath the gate when the bias is zero and "d" denotes the width of the depletion layer when the gate voltage is applied. The width d is given as K $(V_{bi}-V)^{\frac{1}{2}}$ in the case of a Schottky barrier gate, where K is a constant proportional to the carrier density and the dielectric constant of the active layer 2, $V_{bi}$ represents a built-in voltage and V represents the applied voltage (positive). Accordingly, the drain current increases as the positive voltage V applied to the gate electrode 5 is increased and hence the width d of the depletion layer is decreased, while the same is saturated at $V=V_{bi}$.

Meanwhile, the switching speed of a gallium arsenide field effect transistor is increased as the drain current is increased. The drain current is increased by increasing $V_{bi}$. In the case of a Schottky barrier gate, $V_{bi}$ is approximately 0.6V and it is difficult to increase the same any more. However, $V_{bi}$ can be increased by implementing the gate electrode 5 as a p-n junction type and accordingly the drain current can also be increased.

FIG. 2 is a sectional view showing a conventional junction gate gallium arsenide field effect transistor having a p-type layer 7 formed immediately beneath the gate electrode 5 through a diffusion method. In the case of a p-n junction gate, the width d is given as K $(V_{bi}-V)^{\frac{1}{2}}$. In this case, $V_{bi}$ is 0.9 to 1.0V and is higher by 0.3 to 0.4V than that in case of a Schottky barrier type gate. The p-type layer 7 can be formed in the n-type layer 2 formed at the area between both the source and drain electrodes 3 and 4 through a diffusion method or an ion implantation method. Since any diffusion method or ion implantation method requires a high temperature process, the gate length is prolonged beyond a desired length, resulting in a possibility of a degraded high frequency characteristic of the resultant field effect transistor. Propriety or impropriety of a high frequency characteristic of a field effect transistor is determined as a function of a current gain cutoff frequency $f_t$, which is proportional to $g_m D_{gs}$, where $gG_m$ is a transconductance and $C_{gs}$ is a capacitance between the gate and source electrodes. A p-n junction gate field effect transistor formed as described above has a width d of a depletion layer proportional to the $\frac{1}{2}$ power of the applied voltage and therefore has $g_m$ smaller than, and $C_{gs}$ larger than those of a Schottky barrier gate field effect transistor. Therefore, while a p-n junction gate field effect transistor has an increased switching speed in a relatively low frequency, the same has a degraded switching speed in a high frequency region.

SUMMARY OF THE INVENTION

Briefly described, the present invention comprises a junction type field effect transistor, comprising: source and drain electrodes formed apart from each other on a first conductivity type semiconductor region, a gate electrode formed at the area between the source and drain electrodes on the first conductivity type semiconductor region and formed of a metal providing a second conductivity type impurity to the first conductivity type semiconductor region, and a second conductivity type semiconductor region formed immediately beneath the gate electrode.

Preferably, a transistor according to the present invention includes a junction between the semiconductor and a metalized oxide film in the form of an intermetallic compound, below the gate electrode. The lateral dimensions of the junction are preferably substantially identical to the lateral dimensions of the gate electrode.

Briefly described, the present invention also comprises a method of manufacturing a junction type field effect transistor, comprising the steps of: forming a source and drain electrodes separate by and apart from each other on a first conductivity type semiconductor region, depositing a gate electrode on the first conductivity type semiconductor region at the area between the source and drain electrodes, the gate electrode being made of metal serving as an impurity of opposite conductivity to the first conductivity type semiconductor region, and heating the first conductivity type semiconductor rejoin at a temperature lower than the melting point of the metal, thereby to form a second conductivity type semiconductor region immediately beneath the gate electrode.

According to the present invention, a junction type field effect transistor having a gate electrode of an alloy type p-n junction is provided. As a result, the diffusion voltage $V_{bi}$ of the inventive junction type field effect transistor is higher than that of a conventional Schottky barrier gate field effect transistor. The transconductance $g_m$ of the inventive junction type field effect transistor is also increased since the width of the depletion layer is proportional to $(V_{bi}-V)^{\frac{1}{2}}$. Furthermore, by proper selection of electrode materials, the manufacturing process may utilize a low temperature (e.g., 300° to 400° C.) sintering step, eliminating a high temperature process such as required in the case of forming a p-type layer by a diffusion process accordingly, undersirable lateral diffusion is eliminated, with the result that a gate electrode can be formed with a desired dimension and desired spacing from source and drain electrodes. Thus, the present invention can achieve simultaneously both the feature of a conventional Schottky barrier type field effect transistor and a conventional diffusion type p-n junction field effect transistor. Thus, ajunction field effect transistor is provided having a larger value of $g_m$, a smaller value of $C_{gs}$ and an excellent switching characteristic.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
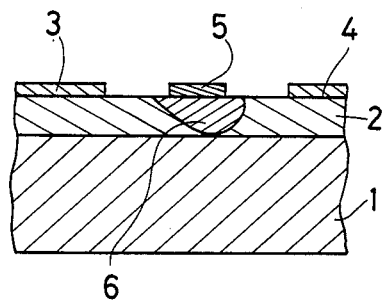
FIG. 1 is a sectional view showing a conventional Schottky barrier gate type normally-off field effect transistor.
Figure 2:
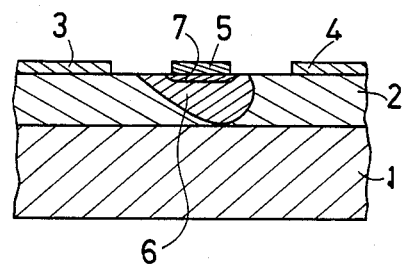
FIG. 2 is a sectional view showing a conventional diffusion type p-n junction gate normally-off field effect transistor.
Figure 3:
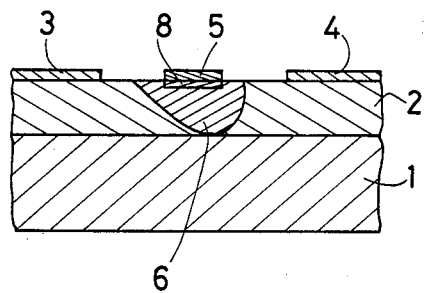
FIG. 3 is a sectional view of an alloy type p-n junction gate normally-off field effect transistor in accordance with the present invention when the gate bias is.

The present invention will now be described in the following with reference to FIG. 3 taking an example of a normally-off type gallium arsenide field effect transistor. FIG. 3 is a sectional view of a normally-off type field effect transistor of one embodiment in accordance with the present invention. The inventive field effect transistor shown comprises a substrate 1 comprising a crystal of a seminsulating gallium arsenide, an n-type gallium arsenide semiconductor region 2 formed on the substrate 1 through liquid and vapor epitaxial methods, source and drain electrodes 3 and 4 formed separately and part from each other on one main surface of the n-type gallium arsenide semiconductor region 2, the source and drain electrodes 3 and 4 being in ohmic contact with the n-type semiconductor region 2, and a gate electrode 5 deposited on the n-type semiconductor region 2 at the area between the source and drain electrodes 3 and 4. The gate electrode 5 is preferably made of a metal providing an acceptor impurity to the above described n-type gallium arsenide semiconductor region 2, such as zinc or cadmium or an alloy including such metal as zinc or cadmium and other metal such as gold, silver, tin, indium or the like, and having a relatively low melting point of say 300° to 400° C. The inventive field effect transistor shown also comprises a depletion layer 6 formed to extend from immediately below the gate electrode 5 to reach the substrate 1 when no voltage is applied to the gate electrode 5, and a p-type region 8 formed immediately beneath the gate electrode 5 at substantially the same area as that of the gate electrode.

Figure 4:
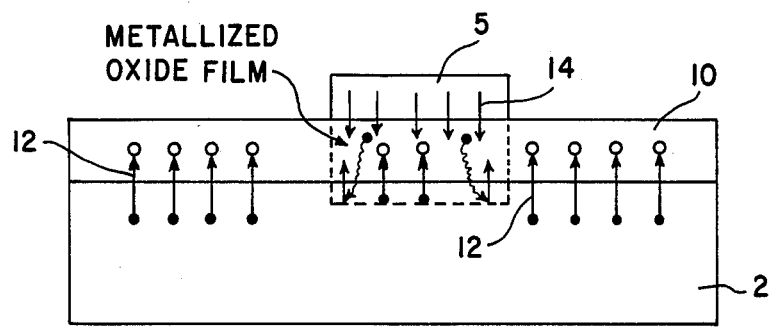
FIG. 4 is a sectional view of a transistor in accordance with the present invention showing details of a thin oxide film between the gate electrode and the semiconductor.

Referring to FIG. 4, additional details of the structure of the invention are seen. Particularly, during processing of the semiconductor, the surface thereof is exposed to various solvents, as in the photolithographic process therefor. By such exposure, a very thin oxide film 10 is formed on the semiconductor surface. Ga and As atoms migrate to the film from the GaAs crystal surface, shown by arrows 12, leaving vacancies in the GaAs crystal structure. Although the exact detail by which the oxide film is metallized is not known, it is believed that during a low-temperature sintering process in which the gate electrode is heated to 300° to 400° C., for example, metal atoms diffuse to the oxide film 10 from gate electrode 5, as shown by arrows 14, thereby metallizing the film. In the oxide film, the Ga and As atoms, together with the acceptor metal impurity atoms from the gate electrode 5, form a p-type intermetallic compound. Moreover, a number of acceptor metal atoms will pass into the semiconductor to fill the vacancies in the n-type GaAs crystal, thus decreasing the n-type carrier density in a region several tens of angstroms (several atom layers to several tens of atom layers) immediately beneath the metal oxide film. Although sufficient numbers of acceptor metals pass into the semiconductor to reduce majority carrier density, the numbers are insufficient to change the conductivity type of the area. Such an area of reduced carrier density enhances the depletion layer 6 within the active layer 2 and further improves operation of the transistor.

Thus, in the present invention, there is provided a transistor in which a p-type intermetallic compound is formed in a metal oxide film immediately beneath the gate electrode. Because of the low temperature heating, lateral diffusion of the acceptor atoms is reduced, to provide a p-type region with lateral dimensions substantially identical to the gate electrode. A p-n junction is provided at the interface between the semiconductor and the metallic oxide film.

Now that the structural feature of a normally-off type gallium arsenide field effect transistor in accordance with the present invention was described in the foregoing, a method of manufacturing the above described field effect transistor will be described. The above described normally-off type gallium arsenide field effect transistor is manufactured through the steps of: (1)

forming the n-type semiconductor region 2 serving as an active layer on the semi-insulating gallium arsenide crystal substrate 1, (2) forming the source and drain electrodes 3 and 4 as ohmic contacts on one main surface of the n-type semiconductor region 2, (3) isolating the respective devices by keeping the source and drain electrodes 3 and 4 independent of each other and the semiconductor region 2 therebetween for each device, (4) forming a gate electrode pattern on one main surface of the n-type semiconductor region 2 at the area between the source and drain electrodes 3 and 4 through a photoetching process, (5) depositing metal serving as an acceptor impurity in a gallium arsenide crystal or an alloy of such metal and other metal and forming thereafter the gate electrode 5 through a lifting technique, and (6) sintering the resultant composite at a temperature slightly lower than the melting point of the metal of the gate electrode 5, thereby to form a very thin p-type intermetallic compound 8 immediately beneath the gate electrode 5 and having generally reduced dimensions.

For example, the resulting alloy layer has a thickness in the range of several tens of angstroms to two hundred angstroms and has surface, or lateral, dimensions which are substantially identical to those of the gate electrode because of virtual elimination of lateral diffusion inasmuch as the formation of the p-layer and the gate are unified and performed at a low temperature, using the gate metal as a pattern. Because of interaction with a film oxide, a p-n junction is formed between the semiconductor and the metalized film. The inventive method of manufacturing a gallium arsenide field effect transistor is particularly characterized by the above described steps (5) and (6).

The gallium arsenide field effect transistor thus manufactured comprises the gate electrode 5 formed in an alloy type p-n junction. As a result, the diffusion potential $V_{bi}$ of the inventive field effect transistor is higher than that of a conventional Schottky barrier gate field effect transistor. Furthermore, since the width of a depletion layer of the inventive field effect transistor is proportional to $(V_{bi}-V)^{\frac{1}{2}}$, the transconductance $g_m$ of the same is high. In addition, since the inventive manufacturing method does not require a high temperature process as in the case of forming a p-type layer through a diffusion process, lateral diffusion is eliminated and the gate electrode 5 can be formed with a desired dimension. As a result, according to the present invention, a junction type field effect transistor achieving both the advantages of a conventional Schottky barrier type field effect transistor and a conventional diffusion type p-n junction field effect transistor is provided.

The gate electrode may be of metal such as zinc or cadmium or an alloy including such metal as zinc or cadmium and other metal such as gold, silver, tin or indium, which includes metal providing a p-type impurity into a gallium arsenide crystal and having a relatively low melting point lower than 300° to 400° C., for example.

In the foregoing the present invention was described as embodied such that the gate electrode made of metal serving as a p-type impurity and having a relatively low melting temperature is formed on the n-type gallium arsenide region, so that a p-n junction may be formed. However, the present invention may be embodied such that a gate electrode made of metal providing an n-type impurity and having a relatively low melting point is formed on a p-type gallium arsenide region, so that a p-n junction may be formed. The metal serving as an n-type impurity and having a relatively low melting temperature may comprise tin, an alloy of gold and tin, an alloy of gold and silicon, or an alloy of gold and germanium.

In accordance with the present invention, a 15-stage ring oscillator was fabricated which comprises gallium arsenide p-n junction field effect transistors having a gate length of 1 μm and the gate width of 20 μm formed with Au-Zn as a gate electrode metal. Because the dimensions of a gate formed in accordance with the invention are substantially identical with the gate electrode, these dimensions are reduced to small values as above noted. Thus, for a device formed in accordance with the invention the gate-source and the gate-drain capacitances are significantly reduced from previously available values. As a result, a device formed in accordance with the present invention has an excellent characteristic of a propagation delay time of 30p sec and a propagation delay time power product of 20fJ. Thus, the inventive junction type field effect transistor such as a gallium arsenide field effect transistor is excellent as a fundamental device of a high speed gallium arsenide integrated circuit. Moreover, since the difference between gate length and gate electrode is virtually eliminated, the distances between gate and source electrodes can be reduced with respect to distance requirements of the prior art. Thus, the present invention provides an improved, high performance, transistor with significantly reduced source resistance.

Although the present invention was described in the foregoing by taking an example of a gallium arsenide field effect transistor, it is to be pointed out that the present invention is not limited only to a field effect transistor made of gallium arsenide but the present invention can be also embodied in a field effect transistor made of any other compound semiconductor.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A junction type field effect transistor, comprising:
    a first conductivity type region of a semiconductor having a main surface,
    source and drain electrodes formed apart from each other on said main surface of said first conductivity type region,
    a gate electrode formed on said main surface of said first conductivity type region at an area between said source and drain electrodes and comprising a metal means for providing to said semiconductor an impurity of a second conductivity type, and
    an interface region between said gate electrode and said first conductivity type region, said interface region including a second conductivity type region therein, said interface region further including a metal oxide, said second conductivity type region formed by said impurity of said second conductivity type provided by said metal means, and
    a P-N junction between said first conductivity type region and said interface region.

2. A junction type field effect transistor as recited in claim 1 wherein said metal oxide interface region includes therein an intermetallic compound forming said second conductivity type region.

3. A junction type field effect transistor as recited in claim 2, wherein said intermetallic compound is formed substantially of said metal from said gate electrode and said semiconductor.

4. A junction type field effect transistor as recited in claim 1 wherein said gate electrode has lateral dimensions along said main surface of said first conductivity type region and said second conductivity type region in said interface region has lateral dimensions substantially identical with said lateral dimensions of said gate electrode.

5. A junction type field effect transistor as recited in claim 4 wherein said first conductivity type region is an N-type GaAs semiconductor and said second conductivity type region is a P-type region including therein metal atoms from said gate electrode.

6. A junction type field effect transistor as recited in claim 5 wherein said metal provides a p-type dopant impurity for said GaAs semiconductor.

7. A junction type field effect transistor as recited in claim 2 wherein said p-n junction is formed between said semiconductor and said intermetallic compound forming said second conductivity type region.

8. A junction type field effect transistor comprising:
a semiconductor region of a first conductivity type and having a main surface,
source and drain electrodes formed apart from each other on said main surface of said first conductivity type semiconductor region,
a gate electrode formed on said main surface of said first conductivity type semiconductor region at an area between said source and drain electrodes and comprising a metal means for providing an impurity of a second conductivity type with respect to said first conductivity type semiconductor region, said gate electrode having a lateral dimension along said main surface, and
a region of said second conductivity type formed in a metallized oxide film immediately beneath said gate electrode and having a surface lateral dimension substantially identical with said lateral dimension of said gate electrode, said second conductivity type region formed by said impurity of said second conductivity type provided by said metal means.

9. A junction type field effect transistor comprising:
a semiconductor region of a first conductivity type and having a main surface,
source and drain electrodes formed apart from each other on said main surface of said first conductivity type semiconductor region,
a gate electrode formed on said main surface of said first conductivity type semiconductor region at an area between said source and drain electrodes and comprising a metal means for providing an impurity of a second conductivity type with respect to said first conductivity type semiconductor region, said gate electrode having a lateral dimension along said main surface, and
a region of said second conductivity type formed in a metallized oxide film immediately beneath said gate electrode and having a surface lateral dimension substantially identical with said lateral dimension of said gate electrode, said second conductivity type region formed by said impurity of said second conductivity type provided by said metal means wherein
said metal of said gate electrode is selected to have a melting point in the range of 300° C. to 400° C.

10. A junction type field effect transistor in accordance with claim 8, wherein said gate electrode has a lateral length dimension of approximately 1 micron.

11. A junction type field effect transistor, comprising:
a first conductivity type region of a semiconductor having a main surface,
source and drain electrodes formed apart from each other on said main surface of said first conductivity type region,
a gate electrode formed on said main surface of said first conductivity type region at an area between said source and drain electrodes and comprising a metal means for providing to said semiconductor an impurity of a second conductivity type, and
interface means between said gate electrode and said first conductivity type region, said interface means including an oxide film, said oxide film having a second conductivity type region therein, said second conductivity type region formed by said impurity of said second conductivity type provided by said metal means, and a P-N junction between said first conductivity type region and said oxide film.

* * * * *

UNITED STATES PATENT AND TRADEMARK OFFICE
CERTIFICATE OF CORRECTION

PATENT NO. : 4,801,987

DATED : January 31, 1989

INVENTOR(S) : Mitsuyuki OTSUBO et al.

It is certified that error appears in the above-identified patent and that said Letters Patent is hereby corrected as shown below:

On the title page

Under [30] Foreign Application Priority Data, please correctly identify the Japanese reference as follows:

Sep. 10, 1981 [JP] Japan ............... 56-143596

Signed and Sealed this

Tenth Day of October, 1989

Attest:

DONALD J. QUIGG

Attesting Officer

Commissioner of Patents and Trademarks